United States Patent [19]

Saitoh et al.

[11] Patent Number: 5,768,214
[45] Date of Patent: Jun. 16, 1998

[54] SEMICONDUCTOR MEMORY DEVICE

[75] Inventors: Ken Saitoh, Akishima; Shunichi Sukegawa, Tsukuba; Tadashi Tachibana, Tsuchiura; Makoto Saeki, Hamura; Yukihide Suzuki, Akishima, all of Japan

[73] Assignee: Texas Instruments Incorporated, Dallas, Tex.

[21] Appl. No.: 689,548

[22] Filed: Aug. 9, 1996

[30] Foreign Application Priority Data

Aug. 11, 1995 [JP] Japan ................ 7-227021

[51] Int. Cl.$^6$ ................................ G11C 8/00
[52] U.S. Cl. ............... 365/233.5; 365/202; 365/207
[58] Field of Search ............... 365/207, 233.5, 365/202

[56] References Cited

U.S. PATENT DOCUMENTS

| | | | |
|---|---|---|---|
| 4,727,516 | 2/1988 | Yoshida et al. | 365/233 |
| 5,414,672 | 5/1995 | Ozeki et al. | 365/233 X |
| 5,544,115 | 8/1996 | Ikeda | 365/207 |

*Primary Examiner*—Do Hyun Yoo
*Attorney, Agent, or Firm*—Gerald E. Laws; Richard L. Donaldson

[57] ABSTRACT

A semiconductor memory device in which erroneous operation with respect to undesired level changes of the input address signal is prevented, and appropriate operation of the main amplifier is ensured. The semiconductor memory device has a main amplifier activating pulse generator 112' which includes response sensitivity reduction circuit 10, response sensitivity selector 12, and main amplifier activating pulse generator 14. The response sensitivity reduction circuit 10 can reduce the response sensitivity or input sensitivity of the circuit 112' with respect to an input address transition detection pulse ATD. The response sensitivity selector 12 selects either a first input terminal A1 or a second input terminal A2, depending on the output state of the main amplifier activating pulse generator 14. Consequently, when there is no output of a main amplifier activating pulse MA from the main amplifier activating pulse generator 14, the response sensitivity selector 12 switches to first input terminal A1 to select response sensitivity reduction circuit 10; when a main amplifier activating pulse MA is output, the selector 12 switches to second input terminal A2 to select bypass circuit 11.

12 Claims, 7 Drawing Sheets

SEMICONDUCTOR MEMORY DEVICE

This invention pertains to a type of semiconductor memory device. In particular, this invention pertains to such [devices] as dynamic random access memory devices.

BACKGROUND OF THE INVENTION

FIG. 6 is a diagram illustrating the configuration of the main portion of a typical dynamic random access memory DRAM. FIG. 7 is a diagram illustrating the internal configuration of the address transition detector ATD contained in this DRAM. FIG. 8 is a diagram illustrating the signals, data waveforms and timing for each portion of this DRAM during memory access.

When data are written to or read from the DRAM, row address strobe signal RAS_ and column address strobe signal CAS_ are provided with the memory address signal.

First when RAS_ is in the enable state (FIG. 8(A)), when precharge of each of the bit lines in memory array 100 is completed, after a little delay, the row address signal BXi is taken into the X-address decoder (not shown in the figure) (FIG. 8 (B)), and word line WLi of the row assigned by the row address signal is activated (FIG. 8(C)). Upon activation of word line WLi, the memory information (data) in each memory cell MC connected to it are read to bit line BL (FIG. 8(D)). The data read out, together with the complementary data on the bit complementary line BL_ are input to the sense amplifier SA of each row, and are subject to differential amplification.

On the other hand, when the column address signal BYj is input or latched to Y-address buffer 102 at a prescribed timing, (FIG. 8(E)), address transition detector ATD 104 is activated in response. shown in FIG. 7. ATD 104 has ATD pulse generator circuit 106, YS timing circuit 108, MAEQ pulse generator 110 and MA pulse generator 112.

ATD pulse generator circuit 106 generates ATD pulse ATD in response to the transition or change in input column address signal BYj (FIG. 8(G)).

YS timing circuit 108 generates FY pulse FY defining the active time of Y-address line YS or the enable time of the output of sense amplifier SA, to be explained later, in response to ATD pulse ATD from ATD pulse generator 106.

This DRAM's Y-decoder 114 is comprised of predecoder 116 and Y-address decoder 118. Predecoder 116 predecodes column address signal BYj from Y-address buffer 102 in response to FY pulse FY, and sends predecode signal PYj to Y-address decoder 118. Y-address decoder 118 decodes predecode signal PYj, and activates Y-address line YSj assigned by column address signal BYj only for the period of time defined by FY pulse FY (FIG. 8(I)).

Upon activation of Y-address line YSj, output transfer gate TR of sense amplifier SAj connected to said Y-address line YSj is turned on, and a pair of complementary read data IO, [IO_] amplified by said sense amplifier SAj are output to data input/output line IO and data input/output complementary line IO_ in the memory array (FIG. 8(K)).

Also, IO switch 120, outside the memory array connected to sense amplifier SAj, is turned on, and the memory read data [IO], [IO_] from sense amplifier SAj are sent to main amplifier 122 through IO switch 120 and data input/output MIO and data input/output complementary line MIO_ outside the memory array.

On the other hand, MA pulse generator 112, in response to ATD pulse ATD from ATD pulse generator 106, generates MA pulse MA for activating main amplifier 122 (FIG. 8(J)).

However, at the same time or just before the rise of MA pulse MA, MAEQ pulse MAEQ from MAEQ pulse generator 110 (FIG. 8(H)) is generated. This MAEQ pulse MAEQ is an equalization control signal for equalizing (short-circuit state) the prescribed node EQ in main amplifier 122, stopping the substantial amplification operation.

However, when MAEQ falls, main amplifier 122 begins the amplification operation with respect to memory read data IO, IO_ from sense amplifier SAj, and outputs memory read data GIO, GIO_ with the prescribed voltage level (FIG. 8(L)). Then, when MA is cut off, the operation of main amplifier 122 comes to an end, and, at the same time, memory read data GIO, GIO_ are latched to output buffer 124 (FIG. 8 (M)).

Also, in the write operation, the data to be written into DRAM are sent to sense amplifier SA from another circuit rather than through main amplifier 122. From there, the data are written into the desired memory cells MC through bit line BL from there.

In ATD 104, when input column address signal BY has its level changed, ATD pulse generator 106 generates ATD pulse ATD with a amplitude corresponding to the degree of the change.

As shown in FIG. 9(a), when the memory address performs normal transition, the signal level of at least one bit of column address signal BY moves from the H-level to the L-level or vice versa. Consequently, ATD pulse ATD with a standard amplitude is generated corresponding to the transition between logic levels H, L. In this way, in response to said standard ATD pulse ATD, FY pulse FY (referred to as YS hereinafter), activating pulse YS, MAEQ pulse MAEQ and MA pulse MA of the respective standard timing and pulse width (duration) are obtained from YS timing circuit 108, MAEQ pulse generator 110, and MA pulse generator 112. Consequently, the various parts can perform initial operations normally, and the desired memory read data GIO, GIO_ are read from main amplifier 122.

YS activating pulse YS, MAEQ pulse MAEQ and MA pulse MA are set to rise after a prescribed interval of time from the rise of ATD pulse ATD, and after a prescribed interval of time from the fall of ATD pulse ATD, these pulses fall. Usually, for each pulse, the length of the delay for a fall is set longer than for a rise.

However, for column address signal BY, some level change may also occur due to noise, etc. in addition to the normal transition in the memory access as explained above.

For example, as shown in FIG. 9(b), at any point in time after a significant interval from the address transition, glitch GL may be generated at any bit byn of column address signal BY. In this case, ATD pulse generator 106 detects said glitch GL, and generates an ATD pulse ATD that is smaller than the standard. Then, in response to said ATD pulse ATD, YS timing circuit 108, MAEQ pulse generator 110 and MA pulse generator 112 generate YS activating pulse YS, MAEQ pulse MAEQ and MA pulse MA, with the pulse width represented by a solid line shorter than the pulse width in the standard case, represented by the dotted line.

In response to these pulses YS, MAEQ, MA, the each part of the Y-address system, in particular, Y-decoders 114 116, 118, sense amplifier SA, main amplifier 122, etc., are operated; the sense amplifier outputs indeterminate memory read data IO, IO_, etc., and main amplifier 122 outputs indeterminate and undesired amplified memory read data GIO, GIO_.

Regarding the aforementioned glitch problems, in the prior art, a method (the response sensitivity reduction method), in which the response sensitivity or input sensitivity of MA pulse generator 112 with respect to ATD pulse ATD in ATD 104 is reduced, is adopted. The reduction of the response sensitivity can be realized by increasing the input threshold of MA pulse generator 112.

FIG. 10 is a diagram illustrating the operation when the response sensitivity reduction method is implemented in MA pulse generator 112. FIG. 10(a) corresponds to the case of the normal transition of the memory address. In this case, the timing and pulse widths of ATD pulse ATD, YS activating pulse YS and MAEQ pulse MAEQ are identical to those in FIG. 7(a). As the input threshold of MA pulse generator 112 rises, the length of the delay of MA pulse MA with respect to ATD pulse ATD becomes slightly longer.

As shown in FIG. 10(b), even when glitch GL is generated at any bit byn of column address signal BY at a time significantly after the address transition, it is still possible to form ATD pulse ATD, YS activating pulse YS and MAEQ pulse MAEQ with the same timing and pulse width as in the case shown in FIG. 9(a). However, for MA pulse generator 112, as the response sensitivity or input sensitivity is low, no response takes place with respect to the small ATD pulse ATD corresponding to glitch GL, and no MA pulse MA is generated. Consequently, main amplifier 122 remains in the inactive state, and it is thus possible to prevent output of the undesired memory read data.

However, in the aforementioned response sensitivity reduction method, as shown in FIG. 11, problems occur when glitch GL is generated immediately after column address signal BY makes a transition in memory access.

In this case, in response to the address transition, a standard ATD is output from ATD pulse generator 106. In response to said standard ATD, YS timing circuit 108, MAEQ pulse generator 110, and MA pulse generator 112 output YS, MAEQ, and MA with standard timing and pulse width, respectively. Consequently, the desired operations are performed by the various parts.

However, as glitch GL is generated immediately afterward, a small ATD is output from ATD pulse generator 106. In response to said ATD, YS timing circuit 108 and MAEQ pulse generator 110 regenerate YS and MAEQ, respectively, without an interval; that is, the duration (pulse width) of YS and MAEQ is prolonged. On the other hand, as MA pulse generator 112 does not respond to small ATD, MA is not regenerated and is not prolonged.

As a result, when memory read data IO, $IO_{13}$ are retrieved from sense amplifier SA to main amplifier 122 with the fall of MAEQ, MA is already cut off, and main amplifier 122 becomes inactive, thus normal memory read data GIO, GIO__ are not output from main amplifier 122, which is a problem.

In order to solve this problem, a method of prolonging the duration (pulse width) of MA pulse MA, for example doubling it, has been considered. This is realized by prolonging the length of the interval from the fall of the standard ATD pulse ATD to fall of MA pulse MA. In this way, as shown in FIG. 11, with respect to glitch GL immediately after the address transition, when MAEQ falls, MA is in the enable state (H-level). Consequently, main amplifier 122 is active, memory read data IO, IO__ from sense amplifier SA are amplified, and it is possible to output normal memory read data GIO, GIO__.

However, the longer the duration of MA pulse MA, the longer the time in which main amplifier 122 is active, and the higher the power consumption inside amplifier 122. As main amplifier 122 operates each time memory access is performed, the total power consumption is significant. In particular, this problem becomes more significant in the case of memory access in the high-speed page mode.

FIG. 12 is a diagram illustrating an example of the configuration of the circuit of main amplifier 122 of this type. This main amplifier 122 is comprised of 2-stage current mirrors 130, 132, and output circuit 134. In the input section, intermediate section, and output section, equalizer EQ comprised of transmission gates 136, 138, 140 is arranged. When MAEQ pulse MAEQ is enabled (H-level), each transmission gate 136, 138, and 140 short-circuits, or, is conductive, so that the complementary signal paths in the amplifier are equalized; consequently, no amplification occurs. However, as long as MA pulse MA is enabled state (H level), transistors 142 and 144 are ON, and DC paths are formed in current mirrors 130 and 132, and electricity is consumed.

Also, even when the duration of MA pulse MA is set longer as explained above, immediately after the address transition, plural glitches GL may be generated consecutively (for example, in the example shown in FIG. 1, when another glitch GL is generated immediately after glitch GL). In this case, there is no way to solve the problem, which is a disadvantage.

It is an object of this invention to provide a type of semiconductor memory device which can prevent erroneous operation with respect to an undesired level change in the input address signal, and which has a main amplifier for performing an appropriate operation.

SUMMARY OF THE INVENTION

A first embodiment of a semiconductor memory device in accordance with the invention comprises: a detection pulse generating means, which detects changes in the level of the input address signal, and generates a detection pulse with an amplitude corresponding to the degree of the change; a sense amplifier control means which responds to the detection pulse from the detection pulse generating means and sets the output of the sense amplifier assigned by the input address signal to the enable state; a main amplifier for amplifying the data output from the sense amplifier; a main amplifier activating means which has a function of selecting either a first sensitivity or a second sensitivity with respect to the detection pulse from the detection pulse generating means, and which responds conditionally to the detection pulse, activating the main amplifier; and a main amplifier control means which, in response to the detection pulse from the detection pulse generating means, starts the substantial amplification operation of the main amplifier with respect to the data from the sense amplifier at a prescribed timing.

A second embodiment of a semiconductor memory device in accordance with the invention structures the main amplifier activating means such that it has a first sensitivity near the sensitivity of the main amplifier control means with respect to the first pulse and a second sensitivity lower than the first sensitivity; and, when the main amplifier is not in the active state, the second sensitivity is selected, while when the main amplifier is in the active state, the first sensitivity is selected.

In accordance with the invention, the main amplifier activating means for activating the main amplifier has a function with which it can select the first sensitivity (such as a sensitivity near the sensitivity of the main amplifier control means) or the second sensitivity (such as a sensitivity lower than the first sensitivity) with respect to the detection pulse from the detection pulse generating means.

In this way, for example, when an address glitch takes place immediately after transition of the address, response is made at the second sensitivity with respect to the standard detection pulse upon the address transition; with respect to the relatively small detection pulse corresponding to the glitch, response is made at the first sensitivity, and it is possible to perform the operation in synchronization with the main amplifier control means.

Also, when an address glitch takes place at any time point after a significant time from the address transition, the first sensitivity is adopted with respect to the relatively small detection pulse corresponding to the glitch, and it is possible to hold the main amplifier in the inactive state.

Figure 1:
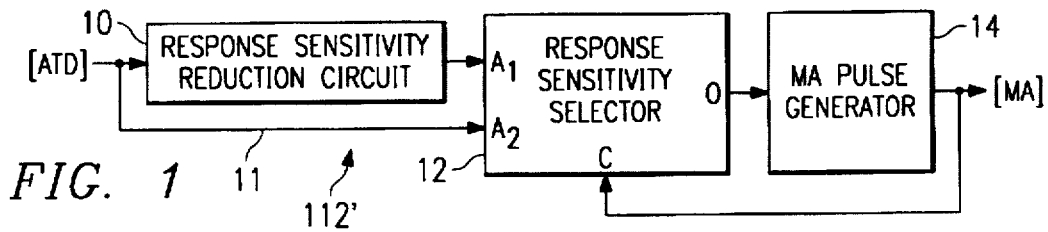
FIG. 1 is a block diagram illustrating the basic configuration of the MA pulse generator in an embodiment of the invention.

Reference numerals as employed in drawings:
10 Response sensitivity reduction circuit
12 Response sensitivity selector
14 MA pulse generator
52 First MA pulse generator
54 Second MA pulse generator
56 AND circuit
100 Memory array
104 Address transition detector ATD
108 YS timing circuit
110 MAEQ pulse generator
112 MA pulse generator
122 Main amplifier
SA Sense amplifier

DETAILED DESCRIPTION OF PREFERRED EMBODIMENTS

In the following, this invention will be explained in more detail with reference to embodiments illustrated by FIGS. 1–5. For the features identical to those in the prior art, FIGS. 6–12 will be referenced at times.

Figure 6:
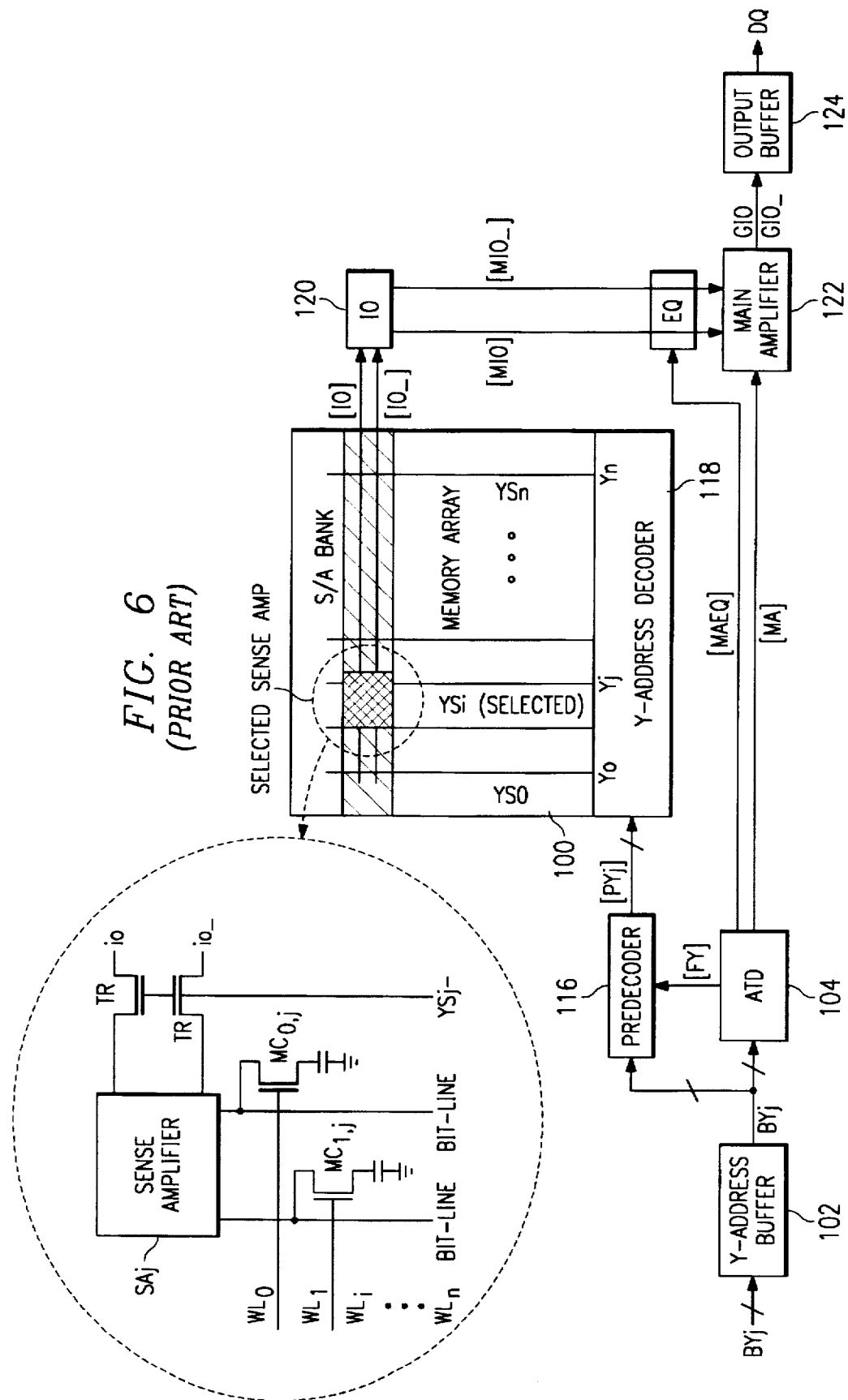
FIG. 6 is a block diagram illustrating the principal constitution of a DRAM for which the MA pulse generator of the present invention can be applied in an embodiment.
Figure 7:
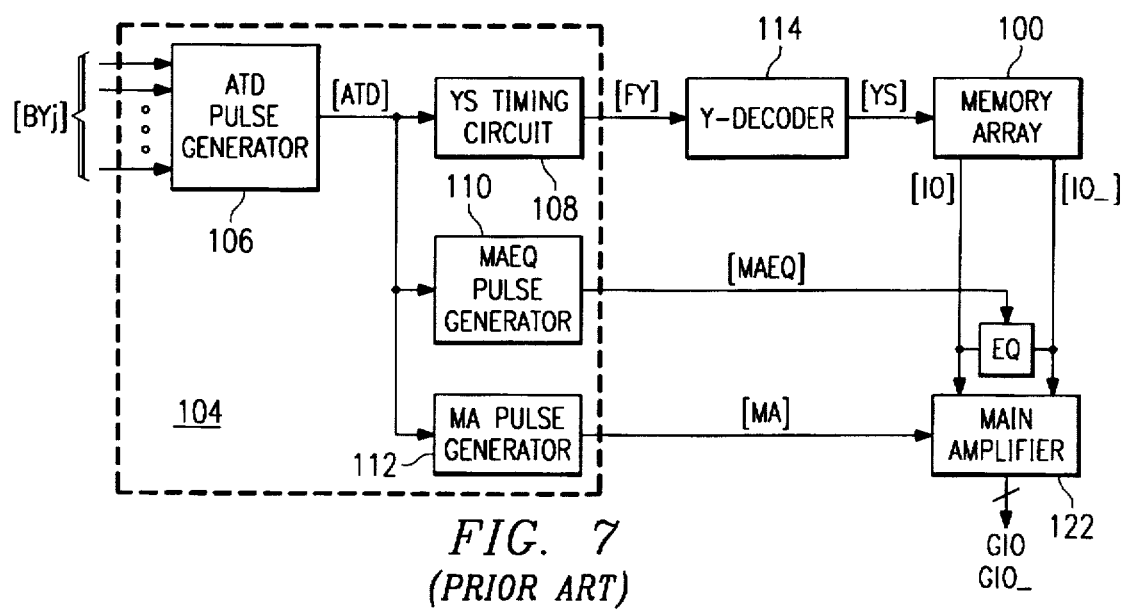
FIG. 7 is a block diagram illustrating the conventional constitution inside the address transition detector ATD contained in the DRAM in FIG. 6.
Figure 8:
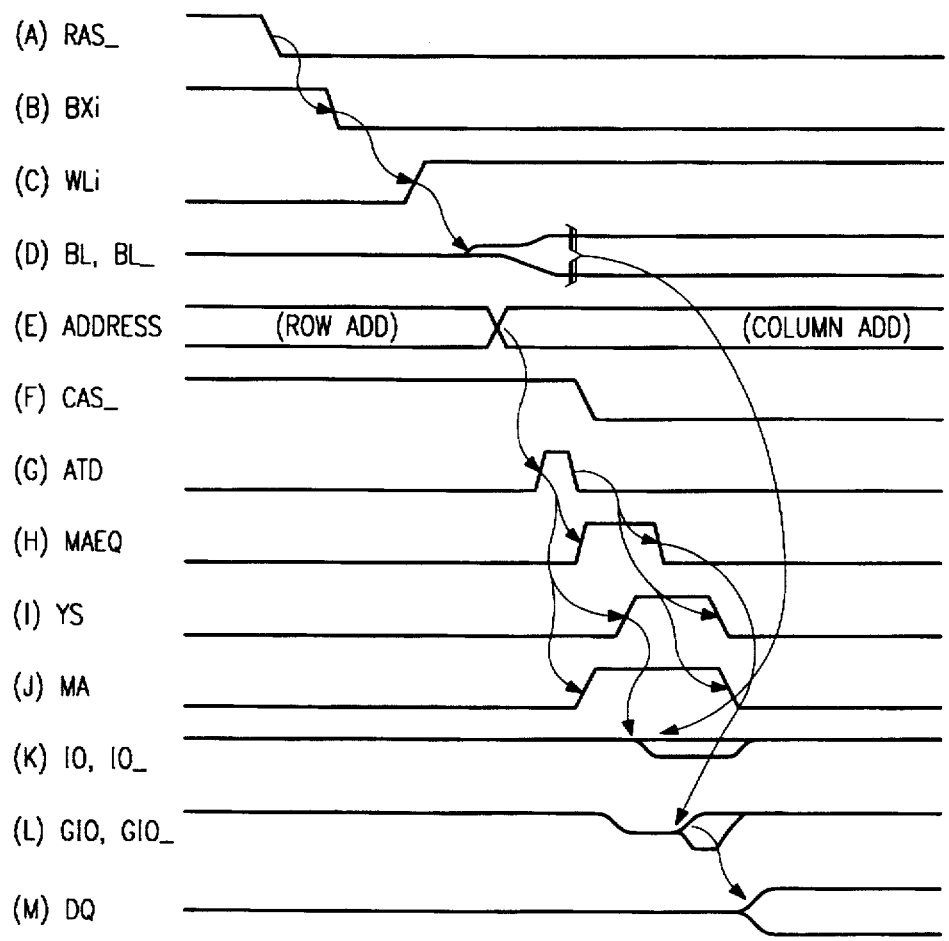
FIG. 8 is a diagram illustrating the waveforms and timing of the signals and data in various portions for illustrating the operation of DRAM in FIG. 6 in the case of memory access.
Figure 9A:
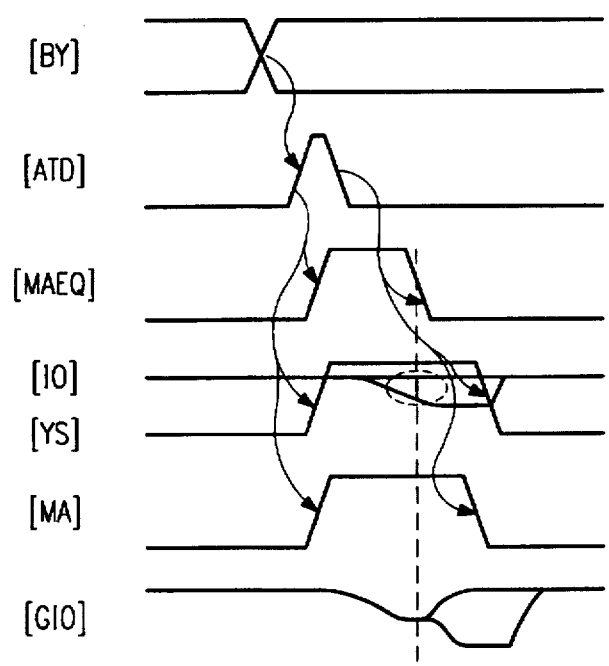
FIGS. 9A–9B are diagrams illustrating the waveforms of the signals of the main portions in the prior art: (a) in the case of transition of column address, and (b) in the case of generation of glitch at any point in time after a significant time from the address transition.
Figure 9B:
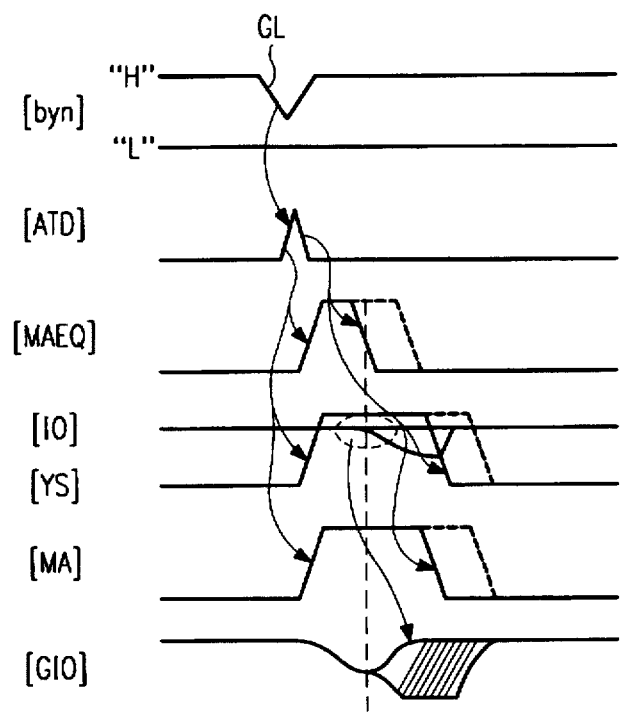

For the DRAM in an embodiment of this invention, the overall configuration is similar to that shown in FIG. 6. However, this embodiment example differs from the conventional configuration in the improvement made for the MA pulse generator in ATD 104.

FIG. 1 is a diagram illustrating the circuit configuration of MA pulse generator 112' in ATD 104 in this embodiment. This MA pulse generator 112' may be replaced by conventional MA pulse generator 112. Consequently, it may be connected between ATD pulse generator 106 and main amplifier 122.

As shown in FIG. 1, MA pulse generator 112' comprises response sensitivity reduction circuit 10, response sensitivity selector 12, and MA pulse generator 14.

Response sensitivity reduction circuit 10 is for reducing the response sensitivity or input sensitivity of the MA pulse generator with respect to input ATD pulse ATD. For example, it may comprise a transistor gate circuit or converter having a relatively high threshold VT. Consequently, when input ATD pulse ATD has a standard amplitude, that is, when it is higher than threshold VT, it is able to pass through response sensitivity reduction circuit 10. However, when the amplitude of input ATD pulse ATD is small and below threshold VT, it is unable to pass through response sensitivity reduction circuit 10. That is, it is cut off by this circuit.

For response sensitivity selector 12, while the output of response sensitivity reduction circuit 10 is input to first input terminal A1, the ATD pulse ATD from ATD pulse generator 106 is input to second input terminal through bypass circuit 11. Also, the output signal of MA pulse generator 14 is input to selection control terminal C.

The response sensitivity selector 12 has a constitution that ensures that either first input terminal A1 or second input terminal A2 is selected (to connect to output terminal 0) depending on the output state of MA pulse generator 14. Consequently, when the output voltage of MA pulse generator 14 is at the L-level (when MA pulse MA is not output), it switches to first input terminal A1; when the output voltage of MA pulse generator 14 is at H-level (when MA pulse MA is output), it switches to second input terminal A2.

MA pulse generator 14 may be a circuit equivalent to conventional MA pulse generator 112 having no response sensitivity reduction means, and it has a response sensitivity near the response sensitivity of YS timing circuit 108 and MAEQ pulse generator 110. Consequently MA pulse generator 14 not only responds with respect to ATD pulse ATD having a standard amplitude and caused by the address transition, but also with respect to the small ATD pulse ATD caused by glitches, etc., and MA pulse MA is generated in such a way that it rises after a prescribed time from a rise of ATD, and it falls after a prescribed time from rise of ATD.

The operation of DRAM in this application example having MA pulse generator 112' with the aforementioned configuration, in particular, the operation of ATD 104 and main amplifier 122, is as follows.

Figure 10A:
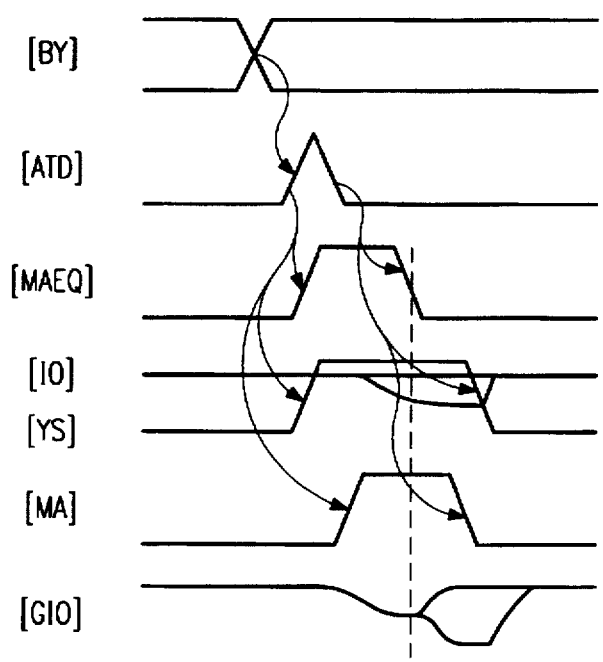
FIGS. 10A–10B are diagrams illustrating the waveforms of the signals of the main portions in the prior art using the response sensitivity reduction method (a) in the case of transition of column address, and (b) in the case of generation of glitch at any point in time after a significant time from the address transition.

First, when an address transition normally occurs without an accompanying glitch GL, the same operation as that shown in FIG. 10(a) takes place. In this case, at the point in time when ATD pulse ATD is generated from ATD pulse generator 106, since the output of MA pulse generator 14 is at L-level, response sensitivity selector 12 is switched to first input terminal A1, and the low response sensitivity is selected. Consequently, although standard ATD pulse ATD from ATD pulse generator 106 has its pulse width shortened slightly and delayed by response sensitivity selector 10, it is still input to MA pulse generator 14 through response sensitivity selector 12, and, upon this pulse, MA pulse MA is output with nearly standard timing and pulse width from MA pulse generator 14.

When MA pulse MA is output, response sensitivity selector 12 is switched to second input terminal A2, and the high response sensitivity is selected. In this case, since glitch GL does not take place immediately afterwards, switching of the response sensitivity essentially has no meaning.

In this way, in response to standard ATD pulse ATD from ATD pulse generator 106, at almost standard timing and pulse width, MA pulse MA is generated from MA pulse generator 112'. On the other hand, from YS timing circuit 108 and MAEQ pulse generator 110, YS activating pulse YS and MAEQ pulse MAEQ at standard timing and pulse width are output. In this way, the desired operations are performed in each part, and desired memory read data GIO, GIO__ are read from main amplifier 122.

Figure 10B:
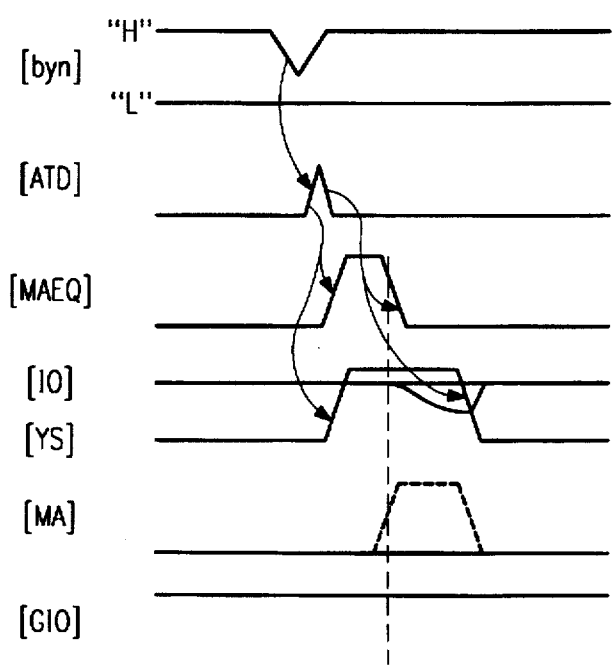

Then, when glitch GL is generated at any bit byn of column address signal BY at a time relatively remote from the address transition, the same operation as that shown in FIG. 10(b) takes place. In this case, in response to glitch GL, ATD pulse generator 106 outputs ATD pulse ATD smaller than standard. In response to a small ATD pulse ATD, YS timing circuit 108 and MAEQ pulse generator 110 generate YS activating pulse YS and MAEQ pulse MAEQ with pulse widths shorter than the standard pulse width.

In MA pulse generator 112', at the time when ATD pulse ATD is generated from ATD pulse generator 106, the output of MA pulse generator 14 is at the L-level. Consequently, response sensitivity selector 12 switches to first input terminal A1, and the low response sensitivity is selected. Consequently, small ATD pulse ATD from ATD pulse generator 106 is cut off by threshold VT of response sensitivity reduction circuit 10, so that it is not input to MA pulse generator 14 and MA pulse MA is not generated. As a result, main amplifier 122 is maintained in the inactive state, and it is possible to prevent output of the undesired memory read data.

Figure 2:
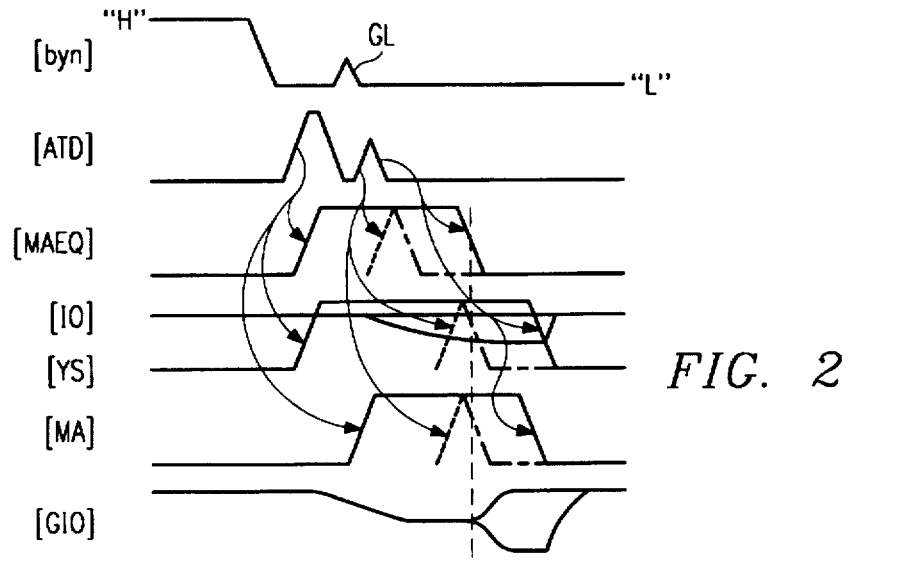
FIG. 2 is a diagram illustrating the waveforms of the signals of the various portions for explaining the function of the MA pulse generator in an embodiment of the invention.

Then, when glitch GL is generated immediately after the address transition in case of memory access, the operation takes place as shown in FIG. 2.

In this case, at first, in response to the address transition, ATD pulse generator 108 outputs standard ATD pulse ATD; then, upon glitch GL, small ATD pulse ATD is output.

Figure 11:
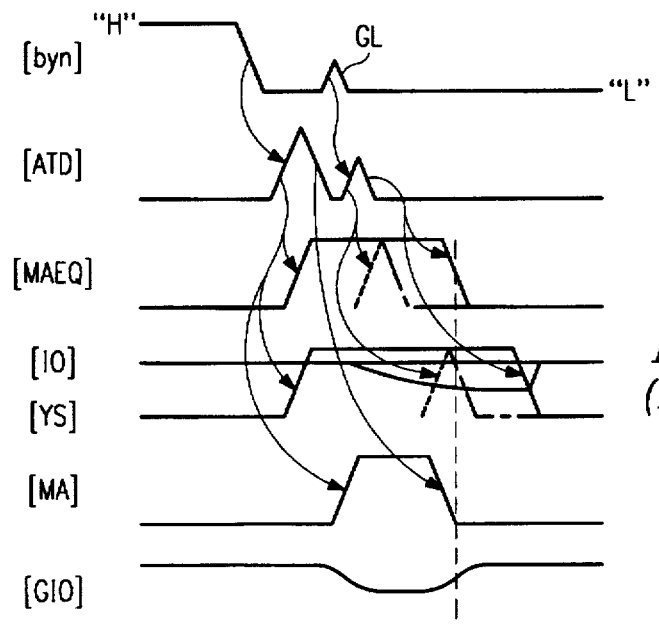
FIG. 11 is a diagram illustrating the waveforms of the signals of the main portions in the prior art using the response sensitivity reduction method, in the case of generation of glitch immediately after the column address transition.
Figure 12:
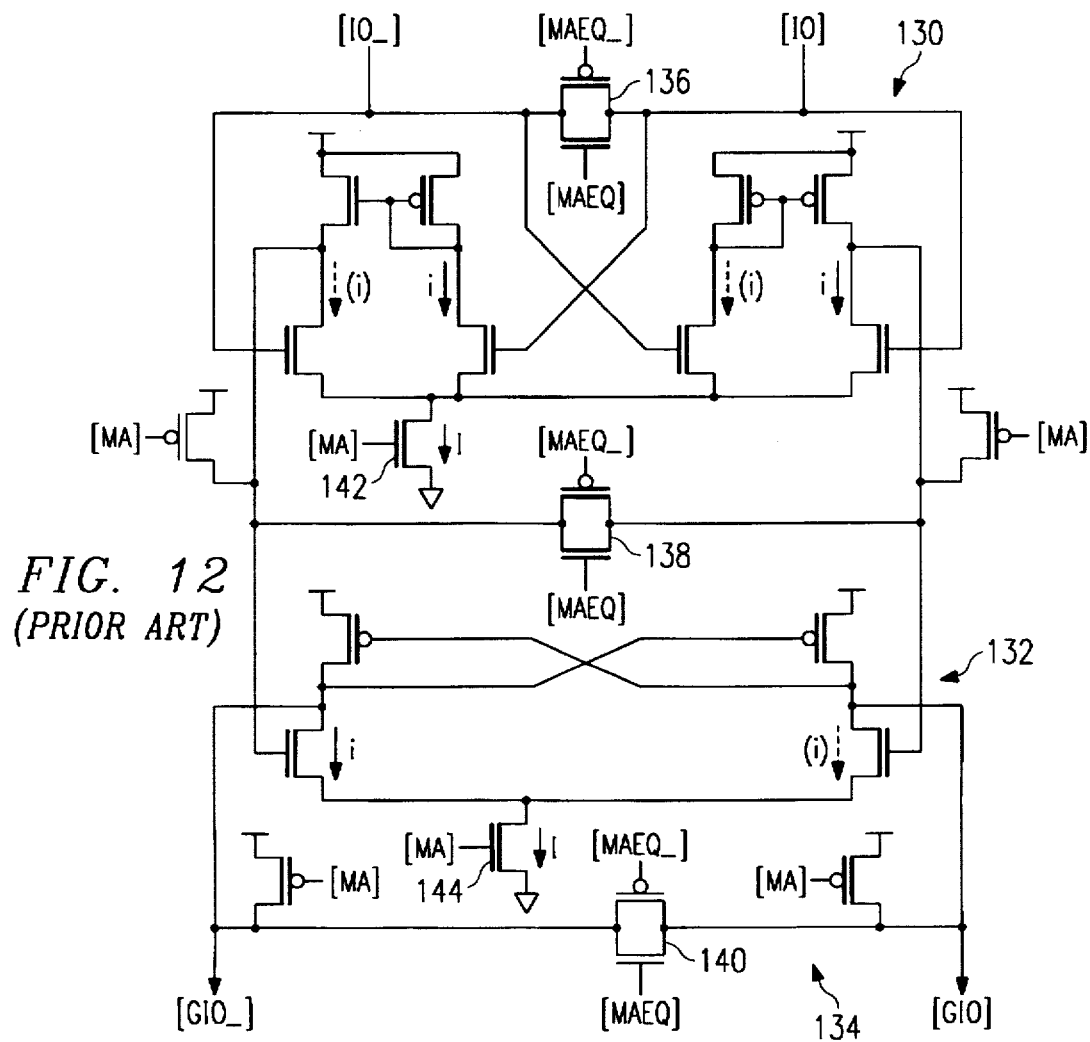
FIG. 12 is a circuit diagram illustrating an example of the constitution of the main amplifier in DRAM.

In response to these two ATD pulses ATD, YS timing circuit 108 and MAEQ pulse generator 110 output YS activating pulse YS and MAEQ pulse MAEQ, respectively. Consequently, the durations (pulse widths) of YS, MAEQ are prolonged. These operations are identical to those in the conventional method (FIG. 11).

For MA pulse generator 112', when standard ATD pulse ATD is input upon the address transition, as the output of MA pulse generator 14 is at the L-level, response sensitivity selector 12 is switched to first input terminal A1, and a low response sensitivity is selected. Consequently, although the pulse width becomes a little narrower due to delay at response sensitivity reduction circuit 10, the standard ATD pulse ATD from ATD pulse generator 106 is still input to MA pulse generator 14 through response sensitivity selector 12, and as a response to this pulse, MA pulse MA is output at almost standard timing and pulse width from MA pulse generator 14.

When MA pulse MA is output from MA pulse generator 14, response sensitivity selector 12 switches to second input terminal A2, and the high response sensitivity is selected.

Consequently, when small ATD pulse ATD is generated by ATD pulse generator 106 upon glitch GL, this ATD pulse ATD is input to response sensitivity selector 12 through bypass circuit 11, and the pulse is then input to MA pulse generator 14. MA pulse generator 14 also responds to this small ATD pulse ATD, and regenerates MA pulse MA. In this way, the duration of MA pulse MA can be extended.

As a result, when MAEQ falls, MA is still held in the enable state (H-level), and main amplifier 122 is in active state. In this way, main amplifier 122 can fetch and amplify memory read data IO, IO__ from sense amplifier SA, and it can perform the memory read operation and output memory read data GIO, GIO__.

In the example shown in FIG. 2, even when another glitch GL is generated immediately after glitch GL, upon ATD pulse ATD as a response to the latter glitch GL, the durations of various pulses YS, MAEQ, and MA are further extended; although the memory access time becomes longer corresponding to the extending of the durations, the various portions can operate normally and synchronously, and the desired memory read data GIO, GIO__ are output from main amplifier 122.

As explained above, in this embodiment, response sensitivity reduction circuit 10 and through bypass circuit 11 are arranged in parallel in the input section of MA pulse generator 112', and selection is made for response sensitivity reduction circuit 10 (with relatively low response sensitivity) or through bypass circuit 11 (with relatively high response sensitivity) according to the output of MA pulse generator 14. In this way, at any point in time, even when an address glitch is generated, it is still possible to handle it appropriately, and it is possible to make main amplifier 122 operate at an appropriate time.

Also, only when glitch GL is generated immediately after the address transition can the pulse width (duration) of MA pulse MA be extended conditionally, that is, for exceptional circumstances, normally, the pulse is as short as can be tolerated. Consequently, it is possible to suppress the electric power consumption of main amplifier 122 to a great extent.

Figure 3:
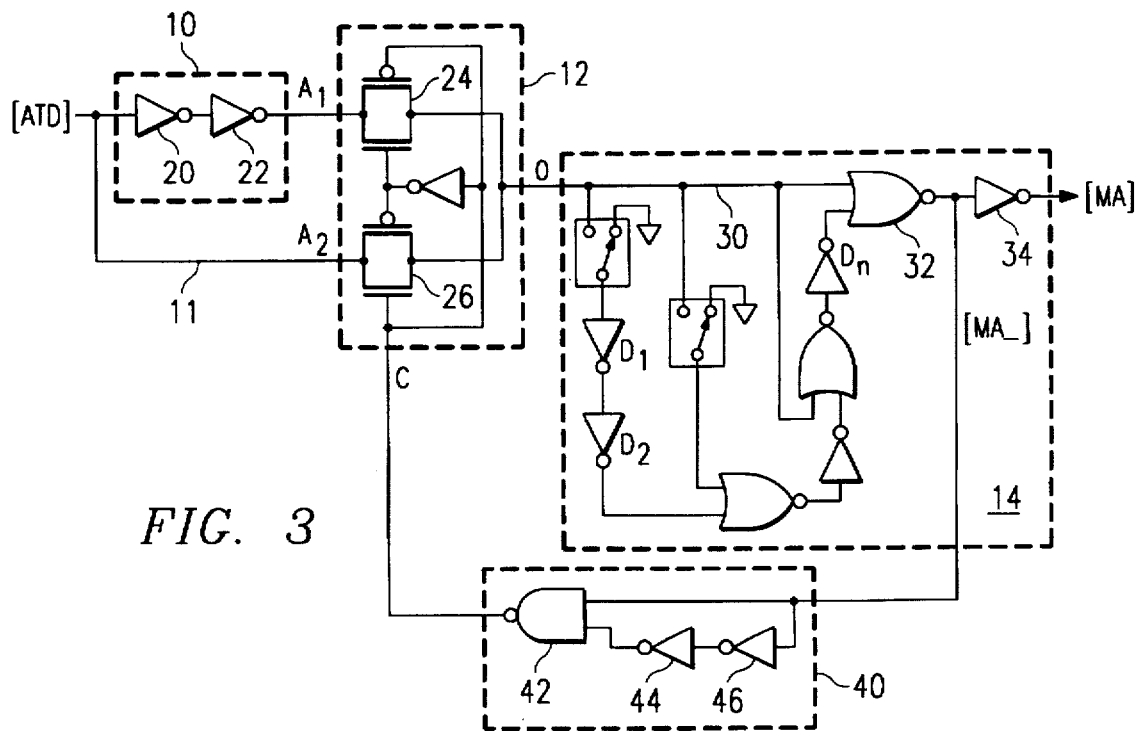
FIG. 3 is a circuit diagram illustrating a specific circuit example of the MA pulse generator in an embodiment of the invention.

FIG. 3 is a diagram illustrating an example of the specific configuration of MA pulse generator 112' in this embodiment. Response sensitivity reduction circuit 10 has two inverters 20, 22 having a high threshold VT connected in cascade. Response sensitivity selector 12 has a pair of transmission gates 24 and 26 connected between first input terminal A1 and output terminal O and second input terminal A2 and output terminal O, respectively. The feedback signal (selection control signal C) from the output of MA pulse generator 14 gives complementary inverse polarities to the control terminals of transmission gates 24, 26. In this way, operation is performed appropriately to ensure that when one of two transmission gates 24, 26 is ON, the other is OFF, and vice versa.

In MA pulse generator 14, plural sections of cascade-connected delay gate circuits D1, D2, ... Dn and through bypass circuit 30 are connected in parallel, and, in the output section, two logic circuits or gate circuits 32, 34 are connected in series. When the input ATD pulse ATD rises, the input signal on the H-level passes through bypass circuit 30 and output gate circuits 32, 34. The corresponding short signal transmission time becomes a delay time, and MA pulse MA rises to H. When ATD pulse ATD falls, at the point in time when the input signal on the L-level passes through delay paths D1, D2, ... Dn and output gate circuits 32, 34, MA pulse MA falls to L after a relatively long delay time.

In this configurational example, a delay circuit 40 comprising NAND circuit 42 and two inverters 44, 46 is inserted into the feedback loop from the output of MA pulse generator 14 to response sensitivity selector 12. Inverters 44 and 46 act as a delay gate circuit. This delay gate circuit 40 delays for a prescribed time the feedback signal MA__ from the output of MA pulse generator 14 (rise from L-level to H-level) of MA pulse generator 14. Consequently, in the input section, the timing delays for a few moments for switching from through bypass circuit 11 to response sensitivity reduction circuit 10. In this way, when a small ATD pulse ATD is input, its rising edge is input through bypass circuit 11 (with high sensitivity), and MA pulse MA can be regenerated. In this way, it is possible to guarantee the operation shown in FIG. 2 more reliably.

It is also possible to realize an appropriate delay time by inserting a delay gate with a low threshold VT into through bypass circuit 11.

Figure 4:
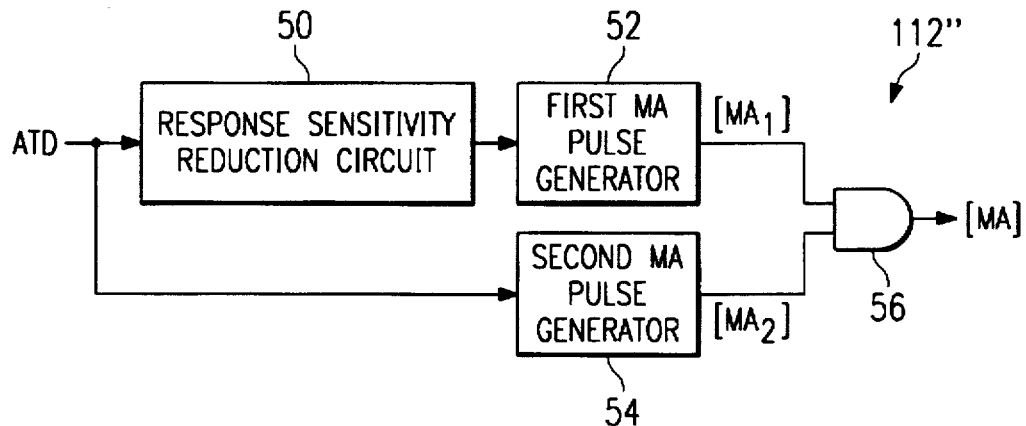
FIG. 4 is a block diagram illustrating the constitution of the MA pulse generator in another embodiment of the invention.

FIG. 4 is a diagram illustrating the configuration of MA pulse generator 112" in another embodiment. In this MA pulse generator 112", response sensitivity reduction circuit 50 may be identical to response sensitivity reduction circuit 10 in the first embodiment. First and second MA pulse generators 52, 54 have the same response sensitivity as that of MA pulse generator 14 in the first embodiment. First MA pulse generator 52 generates first MA pulse MA1 with a relatively large pulse width (e.g., twice the standard pulse width), and second MA pulse generator 54 generates second MA pulse MA2 with a relatively small pulse width (e.g., the standard pulse width). For the outputs of first and second MA pulse generators 52, 54, AND is taken by means of AND circuit 56. The output of AND circuit 56 is fed as normal MA pulse MA to main amplifier 122.

It is also possible to use MA pulse generator 112" with the aforementioned configuration to handle the aforementioned various types of address glitches. For example, when the address transition is performed normally without accompanying glitch GL, as standard ATD pulse ATD is input from ATD pulse generator 106, first and second MA pulses MA1, MA2 on H-level are generated from both first and second MA pulse generators 52 and 54, respectively, and MA pulse MA on H-level corresponding to their AND is output from AND circuit 56. Consequently, almost the same operation as that shown in FIG. 10(a) is performed, and the desired memory read data are output. Also, at any point in time after a significant time from the address transition, glitch GL may be generated at any bit byn of column address signal BY. In this case, although second MA pulse MA2 at H-level is generated from second MA pulse generator 54 with respect to small ATD pulse ATD from ATD pulse generator 106, due to the masking effect of response sensitivity reduction circuit 50, the output of first MA pulse generator 52 remains at L-level. Consequently, there is no output of MA pulse MA from AND circuit 56. As a result, almost the same operation can be performed as that in FIG. 10(b), and it is thus possible to prevent output of the undesired data from main amplifier 122.

Figure 5:
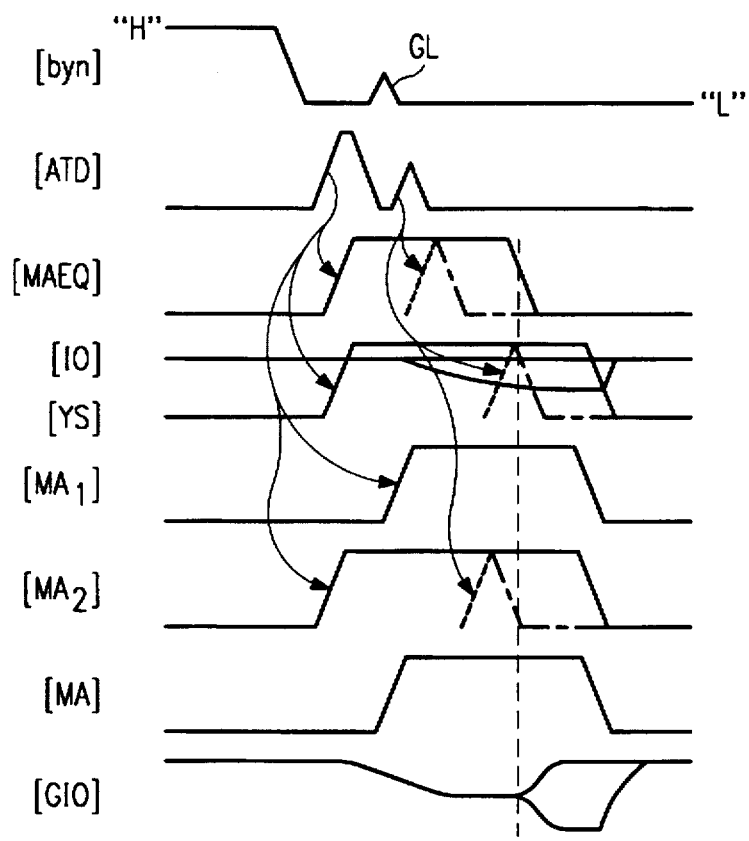
FIG. 5 is a diagram illustrating the waveforms of the various portions for illustrating the function of the MA pulse generator in FIG. 4.

Also, when glitch GL is generated immediately after transition of the column address, the operation shown in FIG. 5 takes place.

In this case, with respect to the initial (standard) ATD pulse ATD corresponding to the address transition, first and second MA pulses MA1 and MA2 on H-level are generated from first and second MA pulse generators 52 and 54, respectively, and MA pulse MA on H-level corresponding to their AND from AND circuit 56 is output.

With respect to the next (small) ATD pulse ATD corresponding glitch GL immediately afterwards, both YS timing circuit 108 and MAEQ pulse generator 110 respond to it, and the pulse widths of respective YS, MAEQ, MA2 are extended. On the other hand, due to the masking function of response sensitivity reduction circuit 50, first MA pulse generator 52 makes no response. However, as the pulse width of second MA pulse MA2 increases, the pulse width of MA pulse MA also increases. Consequently, main amplifier 122 is able to perform an amplification operation with an appropriate timing, the desired memory read operation is performed, and GIO, GIO__ are output.

Also, the sensitivity not only of MA pulse generator 112' 112", but also of YS timing circuit 108) and of MAEQ pulse generator 110 can be set or adjusted as desired. Also, if needed, it is possible to select or switch the sensitivities of these circuits 108 and 110.

As explained above, for the semiconductor memory device of this invention, corresponding to the level change of the address signal, the main amplifier activating means can select either the first sensitivity or the second sensitivity with respect to the detection pulse to make conditional response. Consequently, it is possible to prevent undesired level changes in the input address signal and to perform appropriate operation of the main amplifier.

We claim:

1. A semiconductor memory device, comprising:
   an address transition detector (ATD) operational to form an ATD pulse in response to a transition of an input signal, the ATD further comprising a main amplifier (MA) signal generation circuit coupled to receive the ATD pulse for producing an MA signal in response to the ATD pulse;
   a main amplifier coupled to receive the MA signal, the main amplifier coupled to receive a data signal and operational to amplify the data signal in response to the MA signal; and
   wherein the MA signal generation circuit has a first input threshold sensitivity to the ATD pulse for a first logic level of the MA signal, and the MA generation circuit has a second input threshold sensitivity to the ATD pulse for a second logic level of the MA signal, and wherein the first input threshold sensitivity has a larger magnitude than the second input threshold sensitivity.

2. The semiconductor memory device of claim 1, wherein:
   the MA generation circuit is operable to form the MA signal with a first pulse width in response to a first ATD pulse which has a magnitude that exceeds the first input threshold sensitivity; and
   the MA generation circuit is operable to extend the MA signal to a second pulse width in response to a second ATD pulse which has a magnitude that exceeds at least the second input threshold sensitivity.

3. The semi-conductor memory device of claim 1, wherein the MA generation circuit comprises:
   a response sensitivity reduction circuit with the first input threshold sensitivity coupled to receive the ATD pulse to form a high threshold AID pulse;

a response sensitivity selector with a first input coupled to receive the high threshold ATD pulse and a second input with the second input threshold sensitivity coupled to receive the ATD pulse, the response sensitivity selector operable to form a selected ATD pulse selected from either the first input or the second input in response to a logic level of the MA signal; and a MA pulse generator circuit coupled to receive the selected ATD pulse, operable to form the MA signal with a first pulse width in response to a first ATD pulse which has a magnitude that exceeds the first input threshold sensitivity and operable to extend the MA signal to a second pulse width in response to a second ATD pulse which has a magnitude that exceeds at least the second input threshold sensitivity.

4. The semiconductor memory device of claim 1, wherein the MA generation circuit comprises:

a response sensitivity reduction circuit with the first input threshold sensitivity coupled to receive the ATD pulse to form a high threshold ATD pulse;

a first MA pulse generator circuit coupled to receive the high threshold ATD pulse, operable to form a first MA signal with a first pulse width in response to a first ATD pulse which has a magnitude that exceeds the first input threshold sensitivity;

a second MA pulse generator circuit coupled to receive the ATD pulse, operable to form a second MA signal with a second pulse width in response to a second ATD pulse which has a magnitude that exceeds at least the second input threshold sensitivity; and a logic circuit coupled to receive the first MA signal and the second MA signal to form the MA signal as a logical AND of the first MA signal and the second MA signal.

5. The semiconductor memory device of claim 2, wherein the data signal comprises a pair of complimentary data signals, further comprising:

a main amplifier equalization (MAEQ) generator circuit coupled to receive the ATD pulse for producing a MAEQ signal; and an equalization circuit coupled to the pair of complimentary data signals and also coupled to receive the MAEQ signal, the equalization circuit operable to equalize the complimentary data signals in response to the MAEQ signal.

6. The semiconductor memory device of claim 2, further comprising an array of memory cells arranged to provide the data signal to the main amplifier.

7. The semiconductor memory device of claim 6, further comprising an address decoder connected to the array of memory cells operable to select a particular data cell which provides the data signal to the main amplifier in response to the input signal; and a timing circuit coupled to receive the ATD pulse for producing a sense pulse which is coupled to the address decoder, the address decoder operable to select a particular data cell in response to the sense pulse.

8. The semiconductor memory device of claim 7, wherein the array of memory cells comprises a plurality of dynamic memory cells.

9. A method for operating semiconductor memory device, comprising the steps of:

forming an address transition detector (AID) pulse in response to an input signal;

forming a main amplifier (MA) signal with a first pulse width in response to a first ATD pulse only if the first ATD pulse has a first magnitude which exceeds a first threshold;

extending the MA signal to have an extended pulse width in response to a second ATD pulse which occurs within the first pulse width after the first AID pulse, only if the second ATD pulse has a second magnitude which exceeds a second threshold, where the second threshold has a lower magnitude than the first threshold; and amplifying a data signal in response to the MA signal.

10. The method of claim 9, wherein the step of extending the MA signal further comprises selecting the first threshold or the second threshold in response to a logic level of the MA signal.

11. The method of claim 9, wherein the step of forming the MA signal further comprises:

forming a first MA signal with a first pulse width in response to the first ATD pulse only if the first ATD pulse has the first magnitude which exceeds the first threshold;

forming a second MA signal with a second pulse width in response to the second ATD pulse only if the second ATD pulse has the second magnitude which exceeds the second threshold; and combining the first MA signal and the second MA signal to form the MA signal which is a logical AND of the first MA signal and the second MA signal.

12. The method of claim 11, further comprising:

generating a sense pulse in response to the ATD pulse; and selecting a particular data cell in response to the sense pulse from an array of data cells to supply the data signal to be amplified during the step of amplifying.

* * * * *